United States Patent
Shinoda et al.

(10) Patent No.: US 6,881,268 B2
(45) Date of Patent: Apr. 19, 2005

(54) METHOD AND APPARATUS FOR FORMING REQUIRED GAS ATMOSPHERE

(75) Inventors: Setsuji Shinoda, Kanagawa (JP); Toshiharu Nakazawa, Kanagawa (JP); Nobuharu Noji, Kanagawa (JP); Shunichi Aiyoshizawa, Tokyo (JP)

(73) Assignee: Ebara Corporation, Tokyo (JP)

( * ) Notice: Subject to any disclaimer, the term of this patent is extended or adjusted under 35 U.S.C. 154(b) by 13 days.

(21) Appl. No.: 10/168,823

(22) PCT Filed: Dec. 21, 2000

(86) PCT No.: PCT/JP00/09091

§ 371 (c)(1),
(2), (4) Date: Jun. 25, 2002

(87) PCT Pub. No.: WO01/50061

PCT Pub. Date: Jul. 12, 2001

(65) Prior Publication Data

US 2003/0000470 A1 Jan. 2, 2003

(30) Foreign Application Priority Data

Jul. 6, 2000 (JP) ........................................ 2000/000917

(51) Int. Cl.[7] .......................... C23C 16/455; C23F 1/00; H01L 21/306; B01D 47/05; B01D 39/16
(52) U.S. Cl. .......................... 118/715; 118/728; 118/50; 156/345.29; 156/345.33; 96/234; 96/243; 55/355
(58) Field of Search ...................... 96/234, 243; 55/355; 118/715, 728, 50; 156/345.29, 345.33, 345.34, 345.35, 345.36, 345.26, 345.51

(56) References Cited

U.S. PATENT DOCUMENTS 4,555,251 A * 11/1985 Jonsson et al. ............... 95/169
4,690,208 A * 9/1987 Deck ........................... 165/119
5,188,672 A * 2/1993 Rinnovatore ................ 118/715
5,820,641 A * 10/1998 Gu et al. .................... 55/434.4
5,958,138 A 9/1999 Tomita et al. ............. 118/715
6,086,711 A * 7/2000 Kanishak et al. ...... 156/345.29
6,328,801 B1 * 12/2001 Gary et al. ................. 118/688

FOREIGN PATENT DOCUMENTS

| JP | 2-66400 | 3/1990 |
|---|---|---|
| JP | 5-308170 | 11/1993 |
| JP | 6-177225 | 6/1994 |
| JP | 11-233426 | 8/1999 |

* cited by examiner

*Primary Examiner*—Rudy Zervigon
(74) *Attorney, Agent, or Firm*—Wenderoth, Lind & Ponack L.L.P.

(57) ABSTRACT

The present apparatus includes a casing (1) having a gas introduction opening (3) for introducing a gas into the casing and a gas discharge opening (5) for discharging the gas from the casing, a gas circulating tube passage (8) communicating with the casing for effecting circulation of the gas, a circulating fan (11) for effecting circulation of the gas in the casing through the gas circulating tube passage, and a valve (6, 7) switchable between a position for conducting the introducing and discharging of the gas into and from the casing through the gas introduction opening and the gas discharge opening and a position for effecting circulation of the gas in the casing through the gas circulating tube passage. The apparatus further includes a trap (10), a filter (4) and a heat exchanger (9) for conducting a desired treatment with respect to the circulated gas, such as removal of particles.

17 Claims, 3 Drawing Sheets

METHOD AND APPARATUS FOR FORMING REQUIRED GAS ATMOSPHERE

TECHNICAL BACKGROUND

The present invention relates to an apparatus and a method for filling a space surrounded by a housing or casing with an inert gas and forming a desired gas atmosphere in the space.

For example, in a batch-type low-pressure CVD apparatus, a number of wafers are placed in a casing and a desired film is formed on a surface of each wafer by chemical vapor deposition. The wafer surface must be protected against oxidation due to oxygen or moisture contained in the ambient atmosphere, so as to prevent an oxide film from being formed on the wafer surface.

To this end, conventionally, as shown in FIG. 1, a dry inert gas G is introduced through a gas introduction opening 3 into a space 2 surrounded by a casing 1, and particles are removed from the gas by means of a particle-removing filter (such as an HEPA or ULPA filter) 4, to thereby form a dry, inert gas atmosphere in the space 2 and prevent the above-mentioned oxidation. At the same time, the gas is discharged from the space 2 through a discharge opening 5 at a predetermined flow rate, thus preventing contamination of the gas contained in the space.

Thus, in such a system as mentioned above, an inert gas is used in a large amount, so that a running cost becomes inevitably high.

SUMMARY OF THE INVENTION

In view of the above, the present invention has been made. It is an object of the present invention to provide an apparatus and a method which enable an inert gas to fill a space surrounded by a casing and form a desired gas atmosphere in the space, and which are capable of reducing the amount of gas used therein.

That is, the present invention provides an apparatus for forming a desired gas atmosphere, comprising: a casing having a gas introduction opening for introducing a gas into the casing and a gas discharge opening for discharging the gas from the casing; a gas circulating tube passage fluidly communicating with the casing for effecting circulation of the gas; a circulating fan for effecting circulation of the gas in the casing through the gas circulating tube passage; and a valve switchable between a position for conducting the introducing and discharging of the gas into and from the casing through the gas introduction opening and the gas discharge opening and a position for effecting circulation of the gas in the casing through the gas circulating tube passage.

In this apparatus, at an initial stage of operation, a gas is introduced into the casing through the gas introduction opening while the introduced gas is discharged through the gas discharge opening. This is continued until air which exists in the casing before operation is discharged from the casing and the casing is filled with the introduced gas. When the casing is filled with the introduced gas, the valve is switched so that the gas in the casing is subjected to circulation through the gas circulating tube passage. With the gas being circulated, a desired treatment for maintaining the gas in a predetermined condition, such as removal of moisture from the gas, can be conducted.

More specifically, the gas circulating tube passage can be connected between the gas introduction opening and the gas discharge opening. The switchable valves can be respectively provided at the gas introduction opening and the gas discharge opening so that the above-mentioned switching is conducted.

In the gas circulating tube passage, a filter for removing particles contained in the circulated gas and a trap for cooling and condensing moisture contained in the gas and removing the moisture from the gas may be provided. Further, a heat exchanger for effecting heat exchange between the gas which flows into the trap and the gas which flows out of the trap may also be provided.

Further, in the casing, a gas flow equalizing mechanism may be provided in the casing for equalizing flow of the gas passed through the casing.

The present invention also provides a method for forming a desired gas atmosphere in a space in a casing. This method comprises the steps of: introducing a gas into the space while discharging the gas from the space; and stopping the introducing and discharging of the gas when the space is filled with the gas, and circulating the gas in the space through a gas circulating passage communicating with the casing.

This method may further comprise the step of conducting a desired treatment with respect to the circulated gas, such as removal of particles. The method may further comprise the step of equalizing flow of the gas in the casing.

BRIEF DESCRIPTION OF THE DRAWINGS

FIG. 3 shows an example of a general construction of a trap used in the apparatus of FIG. 2, wherein FIG. 3(a) is a side cross-sectional view and FIG. 3(b) is a cross-sectional view, taken along the line A—A in FIG. 3(a).

PREFERRED EMBODIMENTS OF THE INVENTION

Hereinbelow, an embodiment of the present invention is described, with reference to the accompanying drawings.

Figure 1:
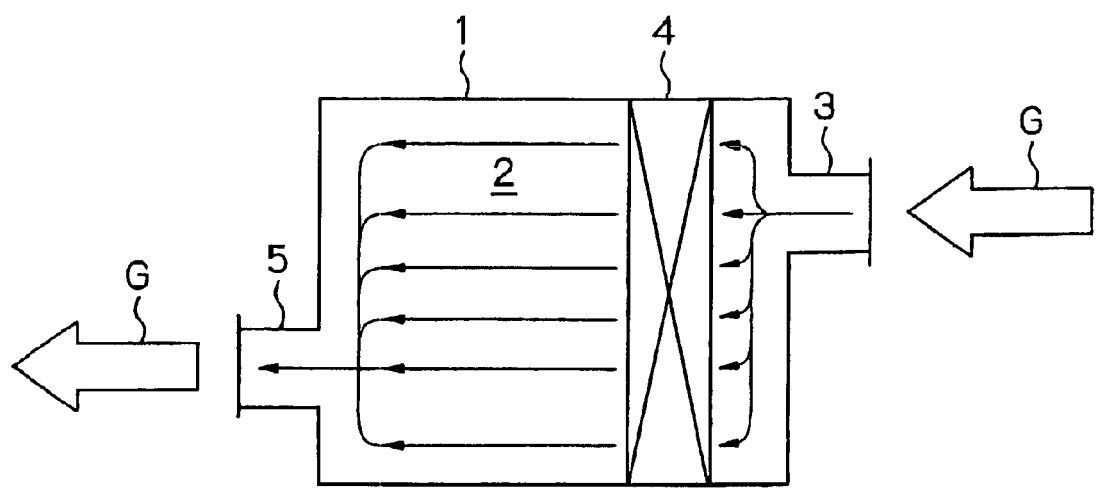
FIG. 1 shows a conventional apparatus for forming a desired gas atmosphere in a space surrounded by a casing.
Figure 2:
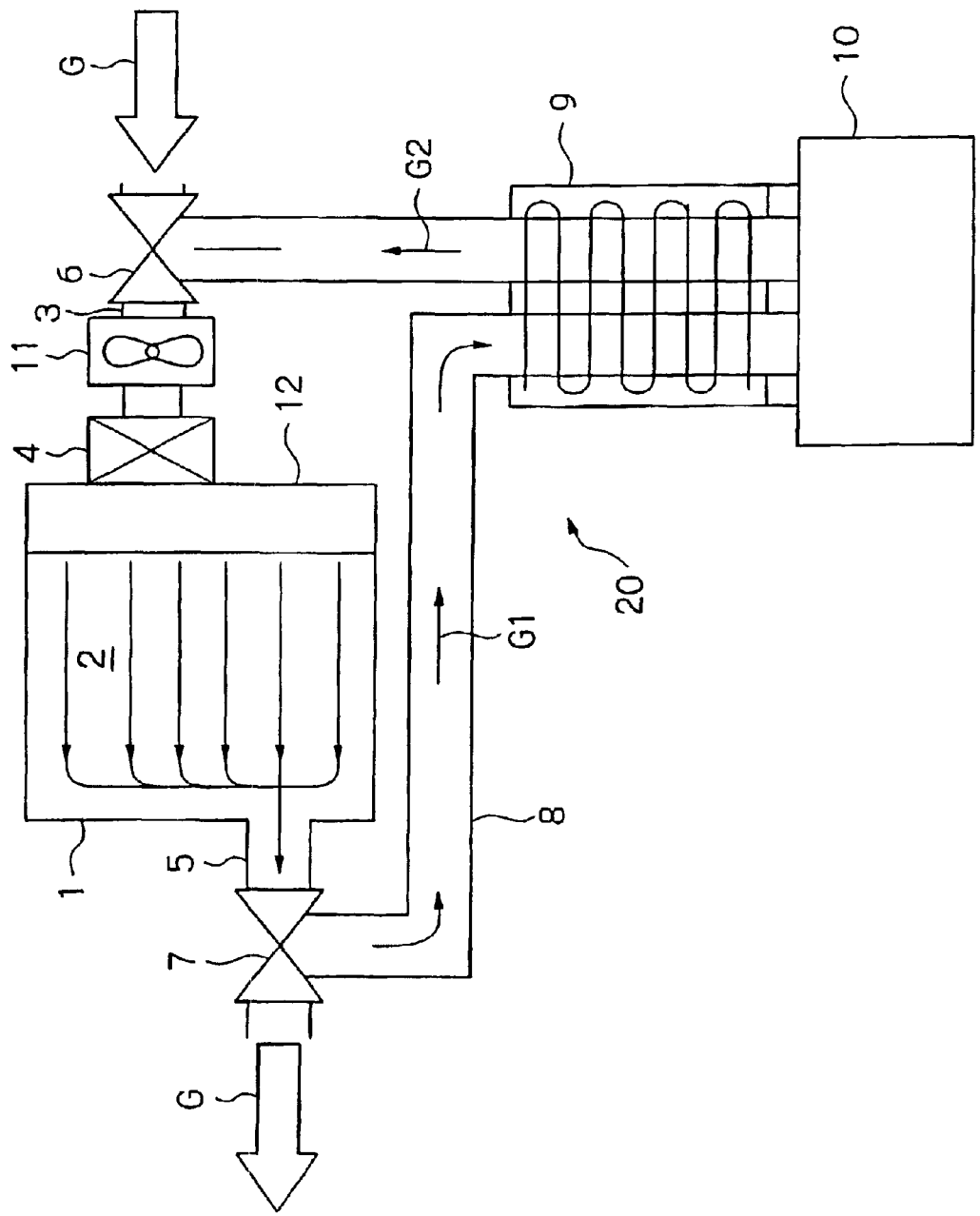
FIG. 2 shows an apparatus of the present invention for forming a desired gas atmosphere.

As shown in FIG. 2, an apparatus of the present invention comprises a casing 1 such as that mentioned above and a gas circulating device 20 for circulating a gas through an inner space 2 of the casing and forming a desired gas atmosphere in the inner space.

As in the case of the above-mentioned conventional apparatus, the casing 1 has a gas introduction opening 3 and a gas discharge opening 5. In this embodiment, as in the case of a CVD apparatus, the inner space 2 of the casing is adapted to have an inert gas atmosphere, such as a nitrogen ($N_2$) gas atmosphere or an argon (Ar) gas atmosphere.

The gas circulating device has a gas circulating tube passage 8 communicated communicating with the gas introduction opening 3 and the gas discharge opening 5 through inlet and outlet switch valves 6 and 7, respectively. The switch valves 6 and 7 are switchable between a position such that the gas is supplied to and discharged from the inner space 2 of the casing 1 and a position such that the supplying and discharging of the gas is stopped and the gas in the inner space 2 is subjected to circulation through the circulating tube passage 8.

A circulating fan 11 is provided at the gas introduction opening 3. A filter 4 is provided downstream of the fan 11. Further, a gas flow equalizing mechanism 12 is provided downstream of the filter 4 so as to equalize flow of an inert gas in the space 2.

A heat exchanger 9 and a trap 10 are provided in the gas circulating tube passage 8. The trap is used for cooling an inert gas G1 passed therethrough so that moisture or an organic gas (organic contaminate) contained in the gas are condensed and caught thereon for removal. An inert gas G2 after removal of moisture or an organic gas is returned to the casing 1 through the filter 4.

The heat exchanger 9 effects heat exchange between the inert gas G1 which is introduced into the trap 10 and the inert gas G2 which is discharged from the trap so that the temperature of the inert gas G2 returned to the casing is maintained at a level higher than a predetermined temperature.

Figure 3:
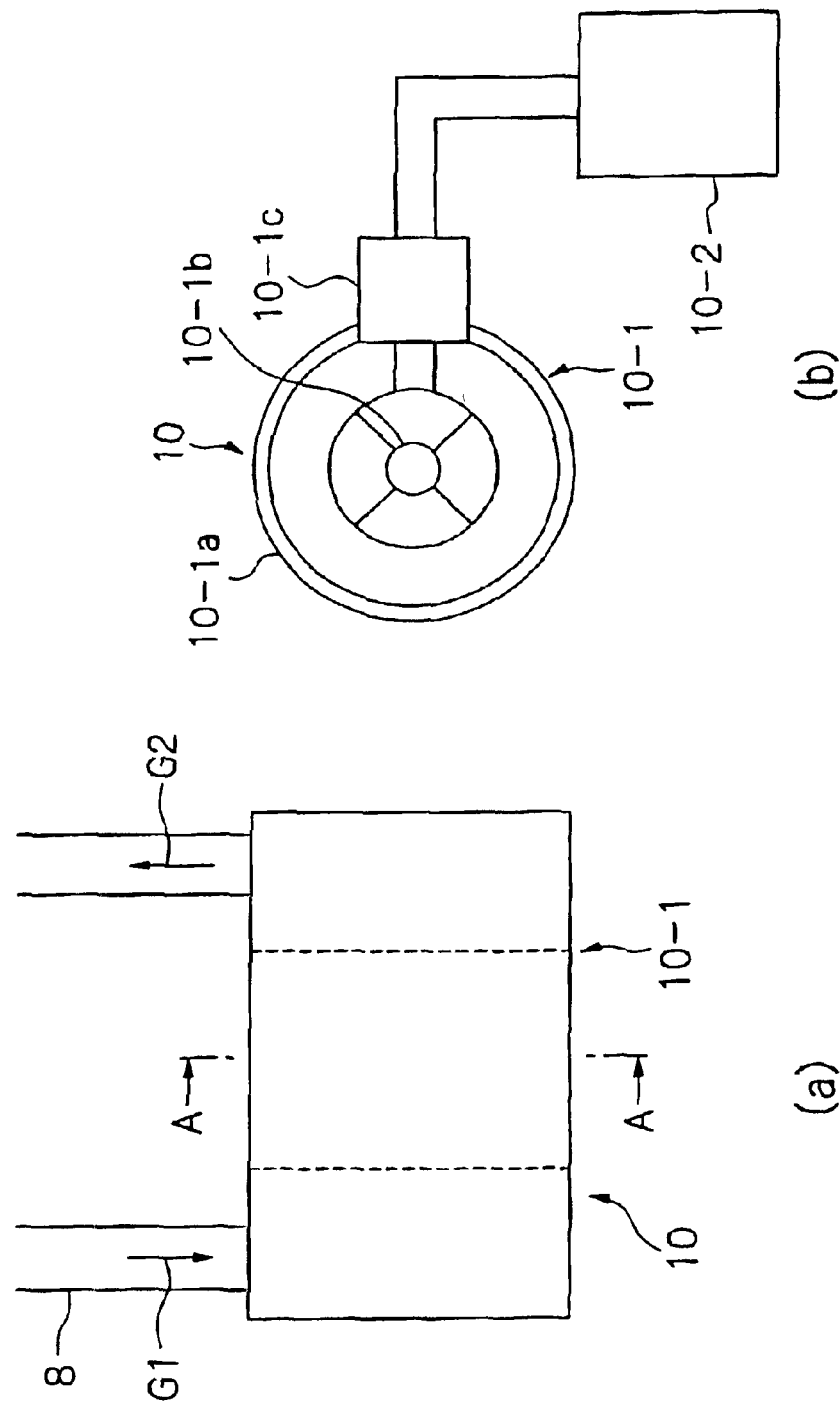

FIG. 3 shows an example of a general construction of the trap 10. FIG. 3(a) is a side cross-sectional view and FIG. 3(b) is a cross-sectional view, taken along the line A—A in FIG. 3(a). As shown in FIG. 3, the trap 10 comprises a cold head 10-1 and a helium compressor 10-2. The cold head 10-1 comprises a cylindrical trap casing 10-1a and a cylindrical condenser 10-1b which is made of a material having good heat conductivity (a metallic material) and provided in the casing in a coaxial relation. The cylindrical condenser 10-1b is connected to the helium compressor 10-2 through a helium refrigerator 10-1c, and is adapted to be cooled to, for example, −100° C. to −200° C. by means of a helium gas. The condenser has a number of radial fins. The inert gas G1 which has flowed into the casing 10-1a of the cold head 10-1 is cooled by the condenser, and moisture or an organic gas contained in the gas G1 is condensed and caught on a surface of the condenser.

As a bearing for the circulating fan 11, it is preferred that a magnetic bearing be used and a magnetic bearing portion and a motor portion be imparted with a canned structure, in order to prevent contamination of the inert gas with particles or organic materials.

To use the apparatus of the present invention, the switchable valves 6 and 7 are first brought into a non-circulation position and an inert gas G is introduced through the gas introduction opening 3 into the casing and discharged from the casing through the gas discharge opening 5. The introduced gas G is passed through the circulating fan 11, the filter 4 and the gas flow equalizing mechanism 12, in which the flow of the gas is equalized and introduced into the space 2.

When the space 2 is filled with the inert gas G while oxygen and moisture in the space 2 are removed, the switchable valves 6 and 7 are switched to a gas circulating position. Consequently, the inert gas in the space 2 is passed through the switchable valve 7, the heat exchanger 9, the trap 10, the heat exchanger 9, the switchable valve 6, the circulating fan 11, the filter 4 and the gas flow equalizing mechanism 12, in which the flow of the gas is equalized and introduced into the space 2.

INDUSTRIAL APPLICABILITY

According to the present invention, the amount of gas utilized can be reduced to a large extent as compared to the above-mentioned conventional technique. When the apparatus of the present invention is used as, for example, a batch-type low-pressure CVD apparatus, a number of semiconductor wafers are set in the space 2 of the casing and a nitrogen gas or an argon gas is introduced into the space and is subjected to circulation. Consequently, the concentration of oxygen and the concentration of moisture in the gas in the space 2 can be suppressed to an extremely low level, and oxidation of the semiconductor wafer surfaces can be prevented. The inert gas should be supplementally added only in an amount sufficient for compensating for leakage from the casing 1. Therefore, a running cost can be reduced.

What is claimed is:

1. An apparatus for forming a desired gas atmosphere, comprising:
    a casing having a gas introduction opening for introducing a gas into said casing and a gas discharge opening for discharging the gas from said casing;
    a gas circulating tube passage fluidly communicating with said casing for effecting circulation of the gas;
    a circulating fan for effecting circulation of the gas in said casing through said gas circulating tube passage;
    a valve switchable between a position for introducing and discharging the gas into and from said casing through said gas introduction opening and said gas discharge opening and a position for effecting circulation of the gas in said casing through said gas circulating tube passage;
    a trap provided in said gas circulating tube passage for cooling the gas and condensing moisture contained in the gas passed through said circulating tube passage and for removing the moisture from the gas; and
    a heat exchanger for effecting heat exchange between the gas flowing into said trap and the cooled gas flowing out of said trap.

2. The apparatus according to claim 1, wherein said gas circulating tube passage is connected between said gas introduction opening and said gas discharge opening.

3. The apparatus according to claim 2, further comprising a gas flow equalizing mechanism provided in said casing for equalizing flow of the gas passing through said casing.

4. The apparatus according to claim 2, further comprising a particle-removing filter or a chemical filter for removing particles contained in the circulated gas.

5. The apparatus according to claim 4, further comprising a gas flow equalizing mechanism provided in said casing for equalizing flow of the gas passing through said casing.

6. The apparatus according to claim 2, wherein said switchable valve comprises a first switchable valve provided at said gas introduction opening, further comprising a second switchable valve provided at said gas discharge opening.

7. The apparatus according to claim 6, further comprising a particle-removing filter or a chemical filter for removing particles contained in the circulated gas.

8. The apparatus according to claim 6, further comprising a gas flow equalizing mechanism provided in said casing for equalizing flow of the gas passing through said casing.

9. The apparatus according to claim 7, further comprising a gas flow equalizing mechanism provided in said casing for equalizing flow of the gas passing through said casing.

10. The apparatus according to claim 1, further comprising a particle-removing filter or a chemical filter for removing particles contained in the circulated gas.

11. The apparatus according to claim 10, further comprising a gas flow equalizing mechanism provided in said casing for equalizing flow of the gas passing through said casing.

12. The apparatus according to claim 10, wherein said switchable valve comprises a first switchable valve provided at said gas introduction opening, further comprising a second switchable valve provided at said gas discharge opening.

13. The apparatus according to claim 11, wherein said switchable valve comprises a first switchable valve provided at said gas introduction opening, further comprising a second switchable valve provided at said gas discharge opening.

14. The apparatus according to claim 1, further comprising a gas flow equalizing mechanism provided in said casing for equalizing flow of the gas passing through said casing.

15. The apparatus according to claim 14, wherein said switchable valve comprises a first switchable valve provided at said gas introduction opening, further comprising a second switchable valve provided at said gas discharge opening.

16. The apparatus according to claim 1, wherein said switchable valve comprises a first switchable valve provided at said gas introduction opening, further comprising a second switchable valve provided at said gas discharge opening.

17. The apparatus according to claim 1, wherein said trap comprises a trap casing and a condenser in said trap casing, said trap casing communicating with said gas circulating tube such that the gas flows through said trap casing so as to be cooled by said condenser.

* * * * *

UNITED STATES PATENT AND TRADEMARK OFFICE
CERTIFICATE OF CORRECTION

PATENT NO. : 6,881,268 B2
DATED : April 19, 2005
INVENTOR(S) : Setsuji Shinoda et al.

It is certified that error appears in the above-identified patent and that said Letters Patent is hereby corrected as shown below:

<u>Title page,</u>
Item [30], Foreign Application Priority Data, please replace "Jul. 6, 2000" with -- Jan. 6, 2000 --.

Signed and Sealed this

Twenty-third Day of August, 2005

JON W. DUDAS
*Director of the United States Patent and Trademark Office*